(12) United States Patent
Park et al.

(10) Patent No.: US 9,349,425 B2
(45) Date of Patent: May 24, 2016

(54) SEMICONDUCTOR DEVICE FOR DRIVING WORD LINE

(71) Applicant: SK hynix Inc., Icheon-si Gyeonggi-do (KR)

(72) Inventors: Sang Il Park, Suwon-si (KR); Sung Soo Xi, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/272,618

(22) Filed: May 8, 2014

(65) Prior Publication Data

US 2015/0235685 A1 Aug. 20, 2015

(30) Foreign Application Priority Data

Feb. 19, 2014 (KR) ........................ 10-2014-0019268

(51) Int. Cl.
*G11C 8/08* (2006.01)
*G11C 8/10* (2006.01)
*G11C 29/12* (2006.01)

(52) U.S. Cl.
CPC .. *G11C 8/08* (2013.01); *G11C 8/10* (2013.01); *G11C 2029/1202* (2013.01)

(58) Field of Classification Search
CPC ..................................... G11C 8/08; G11C 8/10
USPC ..................................................... 365/230.06
See application file for complete search history.

(56) References Cited

U.S. PATENT DOCUMENTS

| | | | | |
|---|---|---|---|---|
| 6,337,831 B1* | 1/2002 | Nam | ........................ | G11C 8/08 |
| | | | | 365/230.01 |
| 7,800,961 B2* | 9/2010 | Son et al. | ................. | 365/189.09 |
| 7,835,199 B2* | 11/2010 | Choi | ........................ | G11C 7/20 |
| | | | | 365/189.09 |
| 8,050,071 B2* | 11/2011 | Yu et al. | .......................... | 365/51 |
| 2009/0303818 A1 | 12/2009 | Kim | | |
| 2009/0323455 A1* | 12/2009 | Yun et al. | ................. | 365/230.06 |
| 2010/0244882 A1* | 9/2010 | Choi | .............................. | 324/765 |
| 2013/0215697 A1* | 8/2013 | Choi et al. | ..................... | 365/203 |

FOREIGN PATENT DOCUMENTS

KR 1020090072804 A 7/2009
KR 1020090126555 A 12/2009

* cited by examiner

*Primary Examiner* — Son Mai
(74) *Attorney, Agent, or Firm* — William Park & Associates Ltd.

(57) ABSTRACT

A semiconductor device includes a driving signal generation unit configured to selectively drive a sub word line driving signal in response to a sub word line select signal. The semiconductor device also includes a sub word line driving unit configured to drive a sub word line in response to a main word line select signal and the sub word line driving signal. Further, the semiconductor device includes leakage path blocking unit configured to block a leakage path formed from the sub word line through the driving signal generation unit, in response to a test signal.

20 Claims, 5 Drawing Sheets

SEMICONDUCTOR DEVICE FOR DRIVING WORD LINE

CROSS-REFERENCES TO RELATED APPLICATION

The present application claims priority under 35 U.S.C. §119(a) to Korean application number 10-2014-0019268, filed on Feb. 19, 2014, in the Korean Intellectual Property Office, which is incorporated herein by reference in its entirety.

BACKGROUND

1. Technical Field

Various embodiments relate to a semiconductor device, and more particularly, to a technology capable of allowing a contact fail of a semiconductor device to be screened.

2. Related Art

A semiconductor memory device has continuously been developed to increase the degree of integration and an operating speed. In order to increase an operating speed, a so-called synchronous memory device capable of operating in synchronization with a clock provided from an outside of a memory chip has been disclosed.

SUMMARY

In an embodiment, a semiconductor device includes a driving signal generation unit configured to selectively drive a sub word line driving signal in response to a sub word line select signal. The semiconductor device also includes a sub word line driving unit configured to drive a sub word line in response to a main word line select signal and the sub word line driving signal. Further, the semiconductor device includes a leakage path blocking unit configured to block a leakage path formed from the sub word line through the driving signal generation unit, in response to a test signal.

In an embodiment, a semiconductor device includes a driving signal generation unit configured to selectively drive a sub word line select signal in response to a sub word line driving signal. The semiconductor device also includes a sub word line driving unit configured to drive a sub word line in response to a main word line select signal and the sub word line driving signal. In addition, the semiconductor device includes a test control unit configured to output the sub word line driving signal to the driving signal generation unit in response to an input signal, and block a leakage path formed from the sub word line through the driving signal generation unit in response to a test signal.

In an embodiment, a semiconductor device includes a driving signal generation unit configured to selectively drive a sub word line driving signal in response to a sub word line select signal. In addition, the semiconductor device includes a sub word line driving unit configured to drive a sub word line in response to a main word line select signal and the sub word line driving signal.

DETAILED DESCRIPTION

Hereinafter, a semiconductor device according to the invention will be described below with reference to the accompanying figures through various embodiments. A semiconductor memory device such as a DRAM (dynamic random access memory) may support various test items. In semiconductor processes, various processing fails may occur. As one of the processing fails, a phenomenon may occur in which a contact hole connecting different metal lines is not open. In this instance, resistance may increase in the internal circuit (for example, a sub word line driving unit) of the semiconductor memory device. Accordingly, as an unnecessary current leakage path is produced in the internal circuit, cell data may be destroyed. Moreover, if the unnecessary current leakage path is produced in the internal circuit, not only the power consumption of the semiconductor device increases, but also the performance of the semiconductor device may be degraded. A technology capable of blocking an unnecessary current leakage path in a semiconductor device and thereby screening a fail due to a contact hole's being not open is therefore described herein.

Figure 1:
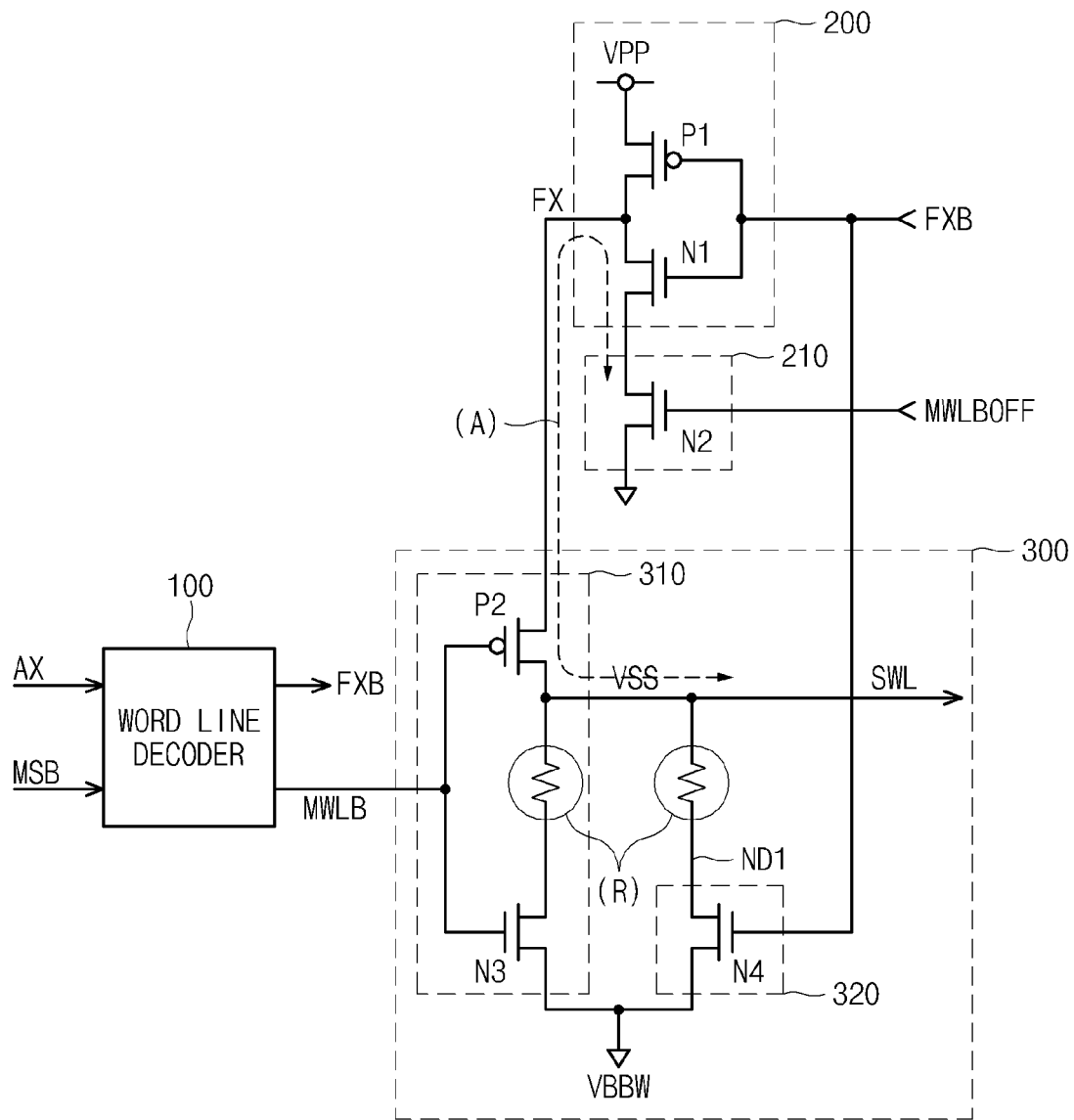
FIG. 1 is a configuration diagram of a semiconductor device in accordance with an embodiment of the invention.

Referring to FIG. 1, a configuration diagram of a semiconductor device in accordance with an embodiment of the invention is illustrated.

The semiconductor device in accordance with an embodiment includes a word line decoder 100, a driving signal generation unit 200, a leakage path blocking unit 210, and a sub word line driving unit 300.

The word line decoder 100 decodes a row address AX and a cell block select signal MSB. The word line decoder 100 also generates a sub word line select signal FXB and a main word line select signal MWLB. The word line decoder 100 also outputs the sub word line select signal FXB to the driving signal generation unit 200. Further, the word line decoder 100 outputs the main word line select signal MWLB to the sub word line driving unit 300.

For reference, each bank provided in a semiconductor device may be divided into a plurality of cell blocks in a row aspect. The cell block select address MSB is a signal for selecting any one of the plurality of cell blocks. A plurality of main word lines are disposed in correspondence to one cell block. In addition, a plurality of sub word lines SWL are electrically coupled to one main word line. The row address AX is a signal for selecting any one of the plurality of main word lines and any one of the plurality of sub word lines SWL.

The driving signal generation unit 200 selectively drives a sub word line driving signal FX in response to the sub word line select signal FXB. More specifically, the driving signal generation unit 200 pull-up or pull-down drives the sub word line driving signal FX in response to the sub word line select signal FXB. The pull-down driving is controlled by the state of a test signal MWLBOFF. The sub word line driving signal FX is an inverted signal of the sub word line select signal FXB.

The driving signal generation unit 200 includes a PMOS transistor P1 and an NMOS transistor N1. The PMOS transistor P1 and the NMOS transistor N1 are electrically coupled in series between the application terminal of a pumping voltage VPP and the leakage path blocking unit 210. A sub word line activation voltage as a voltage having a level greater than a power supply voltage (VDD) may correspond to the pumping voltage VPP as an internal voltage within the semiconductor device.

The PMOS transistor P1 and the NMOS transistor N1 are inputted with the sub word line select signal FXB through the common gate terminal. The PMOS transistor P1 and the NMOS transistor N1 also output the sub word line driving signal FX to the sub word line driving unit 300 through the common drain terminal.

The leakage path blocking unit 210 blocks the path of leakage current. The leakage current may be produced between the sub word line driving unit 300 and the driving signal generation unit 200. A case may occur, in which a metal contact hole to electrically couple a sub word line SWL and a node ND1 is not open.

In such an instance, the parasitic resistance of a metal line which electrically couples the sub word line SWL and the node ND1 increases as indicated by (R). At this time, the voltage of the sub word line SWL unnecessarily rises.

As a result, a leakage current path is formed from the sub word line SWL through the driving signal generation unit 200 to the ground voltage (VSS) line of the leakage path blocking unit 210. The leakage current path may be indicated by (A). In an embodiment, to block the leakage current path (A), the leakage path blocking unit 210 is turned off according to the test signal MWLBOFF.

The leakage path blocking unit 210 includes an NMOS transistor N2. The NMOS transistor N2 is electrically coupled between the driving signal generation unit 200 and the application terminal of the ground voltage (VSS). The NMOS transistor N2 is also applied with the test signal MWLBOFF through the gate terminal.

The test signal MWLBOFF may correspond to a signal inputted from an exterior of the semiconductor device. The test signal MWLBOFF may also correspond to a signal generated through setting of a mode register set or an extended mode register set in the semiconductor device.

The sub word line driving unit 300 selectively drives the sub word line SWL in response to the main word line select signal MWLB. Further, the sub word line driving unit 300 also selectively drives the sub word line SWL in response to the sub word line driving signal FX. The sub word line driving unit 300 includes a driving section 310 and a discharge section 320.

The driving section 310 includes a PMOS transistor P2 and an NMOS transistor N3. The PMOS transistor P2 and the NMOS transistor N3 are electrically coupled in series between the application terminal of the sub word line driving signal FX and the application terminal of a back bias voltage VBBW.

The PMOS transistor P2 and the NMOS transistor N3 are applied with the main word line select signal MWLB through the common gate terminal. The PMOS transistor P2 and the NMOS transistor N3 have the common drain terminal electrically coupled to the sub word line SWL.

The discharge section 320 includes an NMOS transistor N4. The NMOS transistor N4 is electrically coupled between the sub word line SWL and the application terminal of the back bias voltage VBBW. The NMOS transistor N4 is also inputted with the sub word line select signal FXB through the gate terminal.

The semiconductor device in accordance with an embodiment may include a plurality of sub word driving units 300 in one-to-one correspondence to the plurality of sub word lines SWL. However, for the sake of convenience, descriptions will be made for only one sub word line driving unit 300.

The operating procedure of the semiconductor device in accordance with an embodiment, configured as mentioned above, will be described below with reference to the signal waveform diagram of FIG. 2.

A data processing command (for example, a read or write command) is inputted from the exterior. In addition, the row address AX and the cell block select signal MSB are inputted in correspondence to the command. The row address AX and the cell block select signal MSB are decoded through the word line decoder 100. According to the decoding result of the word line decoder 100, the main word line select signal MWLB and the sub word line select signal FXB are then respectively enabled to logic low levels 'L.'

According to this result, as the main word line select signal MWLB is enabled to the logic low level 'L', the PMOS transistor P2 can then be turned on. In addition, as the sub word line select signal FXB becomes the logic low level 'L,' the PMOS transistor P1 is turned on. Then, as the sub word line driving signal FX is enabled to a logic high level 'H,' the sub word line SWL is then activated to a high level.

Thereafter, as the sub word line select signal FXB transitions to a logic high level 'H,' the NMOS transistor N1 is then turned on. Then, the sub word line driving signal FX is disabled to a logic low level 'L,' and the sub word line SWL then transitions to a low level.

Figure 2:
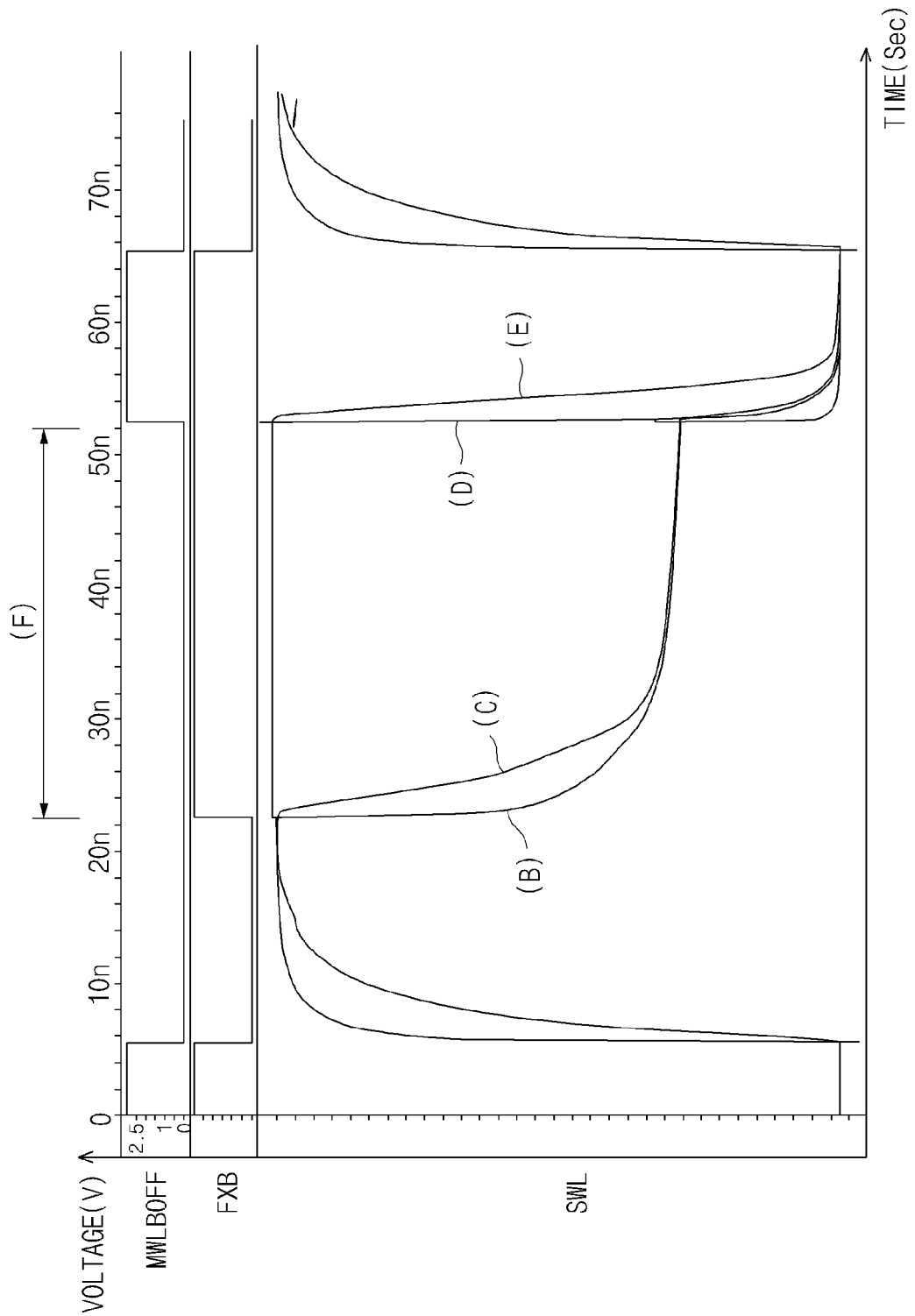
FIG. 2 is a signal waveform diagram explaining the semiconductor device shown in FIG. 1.

In FIG. 2, reference letters (B) and (C) indicate that the potential of the sub word line SWL rises as the main word line select signal MWLB is enabled to the logic low level 'L.' Reference letters (B) and (C) may also indicate that the potential of the sub word line SWL falls as the sub word line select signal FXB transitions to the logic high level 'H.' In FIG. 2, (B) shows the waveform of the sub word line SWL at a position near a cell. In addition, (C) shows the waveform of the sub word line SWL at a position far from the cell.

In this state, where a contact hole between the sub word line SWL and the node ND1 is not open, the resistance of the sub word line SWL may increase. Further, the leakage path (A) may be formed to the driving signal generation unit 200.

Due to this fact, in an embodiment, even where the sub word line select signal FXB transitions to the logic high level 'H,' the main word line select signal MWLB is retained at the logic low level 'L' at it is, according to the test signal MWLBOFF. The test signal MWLBOFF is a signal which controls the main word line select signal MWLB to be disabled for a test period (F) after the sub word line select signal FXB transitions to the logic high level 'H.'

In order to block the leakage path (A) formed to the terminal of the ground voltage in the state where the main word line select signal MWLB has the logic low level 'L' and the sub word line select signal FXB has the logic high level 'H,' the test signal MWLBOFF is retained at the logic low state for the test period (F). Then, as the NMOS transistor N2 is turned off, the leakage path (A) formed to the terminal of the ground voltage may then be blocked.

In a general normal operation, the potential of the sub word line SWL falls before the test period (F). However, in a test mode, the main word line select signal MWLB retains the logic low level state by the test signal MWLBOFF. In addition, the leakage path blocking unit 210 retains the turned-off state. As a result, the potential of the sub word line SWL does not fall and is retained as it is during the test period (F) as indicated by (D) and (E).

Consequently, if data is not normally read or written when the test signal MWLBOFF retains the logic low level during the test period (F), it may be determined that the contact hole's being not open has occurred in the sub word line driving unit 300. In addition, a designer may monitor this and screen the contact hole's being not open.

Figure 3:
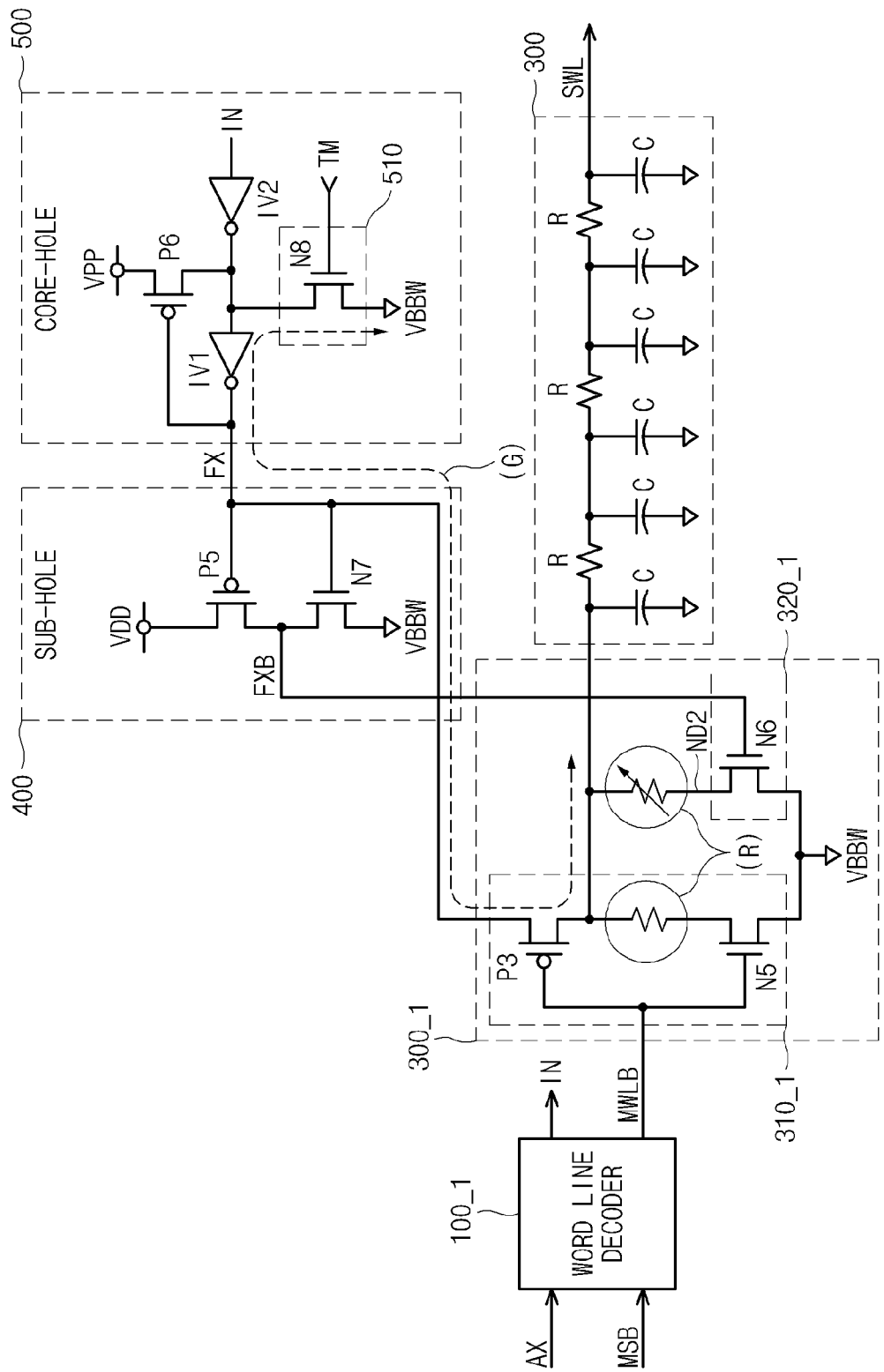
FIG. 3 is a configuration diagram of a semiconductor device in accordance with an embodiment of the invention.

Referring to FIG. 3, a configuration diagram of a semiconductor device in accordance with an embodiment of the invention is illustrated.

The semiconductor device in accordance with an embodiment includes a word line decoder 100_1, a sub word line driving unit 300_1, a delay unit 330, a driving signal generation unit 400, and a test control unit 500.

The word line decoder 100_1 decodes a row address AX and a cell block select signal MSB. The word line decoder 100_1 also generates an input signal IN and a main word line select signal MWLB. The word line decoder 100_1 outputs the input signal IN to the test control unit 500. Further, the word line decoder 100_1 also outputs the main word line select signal MWLB to the sub word line driving unit 300_1.

The sub word line driving unit 300_1 selectively drives a sub word line SWL in response to the main word line select signal MWLB. The sub word line driving unit 300_1 may also selectively drive the sub word line SWL in response to a sub word line driving signal FX. The sub word line driving unit 300_1 includes a driving section 310_1 and a discharge section 320_1.

The driving section 310_1 includes a PMOS transistor P3 and an NMOS transistor N5. The PMOS transistor P3 and the NMOS transistor N5 are electrically coupled in series between the application terminal of the sub word line driving signal FX and the application terminal of a back bias voltage VBBW.

The PMOS transistor P3 and the NMOS transistor N5 are applied with the main word line select signal MWLB through the common gate terminal. The PMOS transistor P3 and the NMOS transistor N5 have the common drain terminal thereof electrically coupled to the sub word line SWL.

The discharge section 320_1 includes an NMOS transistor N6. The NMOS transistor N6 is electrically coupled between the sub word line SWL and the application terminal of the back bias voltage VBBW. The NMOS transistor N6 is also inputted with a sub word line select signal FXB through the gate terminal.

The delay unit 330 includes a plurality of resistors R electrically coupled in series on the sub word line SWL and a plurality of capacitors C electrically coupled in parallel to the sub word line SWL. The respective resistors R and the respective capacitors C may compensate for output delay times from the sub word line SWL to a cell array.

The driving signal generation unit 400 pull-up or pull-down drives the sub word line select signal FXB according to the sub word line driving signal FX. Moreover, the sub word line driving signal FX is an inverted signal of the sub word line select signal FXB.

The driving signal generation unit 400 includes a PMOS transistor P5 and an NMOS transistor N7. The PMOS transistor P5 and the NMOS transistor N7 are electrically coupled in series between the application terminal of a power supply voltage VDD and the application terminal of the back bias voltage VBBW. The PMOS transistor P5 and the NMOS transistor N7 are inputted with the sub word line driving signal FX through the common gate terminal. Further, the PMOS transistor P5 and the NMOS transistor N7 output the sub word line select signal FXB to the discharge section 320_1 through the common drain terminal.

The test control unit 500 blocks the path of leakage current produced among the sub word line driving unit 300_1, the driving signal generation unit 400 and the application terminal of the back bias voltage VBBW. A case may occur, wherein a metal contact hole to electrically couple the sub word line SWL and a node ND2 is not open.

In this instance, the parasitic resistance of a metal line which electrically couples the sub word line SWL and the node ND2 increases as indicated by reference letter (R). At this time, the voltage of the sub word line SWL unnecessarily rises.

As a result, a leakage current path is formed from the sub word line SWL through the driving signal generation unit 400 to the line of the back bias voltage VBBW of the test control unit 500 as indicated by reference letter (G). In an embodiment, in order to block the leakage current path (G), a leakage path blocking unit 510 is turned off according to a test signal TM.

The test control unit 500 includes a PMOS transistor P6, inverters IV1 and IV2, and the leakage path blocking unit 510. The PMOS transistor P6 is electrically coupled between the application terminal of a pumping voltage VPP and the input terminal of the inverter IV1. The PMOS transistor P6 has the gate terminal thereof which is electrically coupled to the output terminal of the inverter IV1. The inverters IV1 and IV2 non-invertingly delays the input signal IN and outputs the sub word line driving signal FX to the driving signal generation unit 400.

The leakage path blocking unit 510 includes an NMOS transistor N8. The NMOS transistor N8 is electrically coupled between the input terminal of the inverter IV1 and the application terminal of the back bias voltage VBBW. The NMOS transistor N8 is applied with the test signal TM through the gate terminal.

The driving signal generation unit 400 for driving a sub word line is disposed in a narrow region where the word line driver and the bit line sense amplifier of a semiconductor device cross each other. The narrow region may hereinafter be referred to as a "sub-hole region." One driving signal generation unit 400 is disposed per one cell array.

In the case where a transistor which is inputted with the test signal TM is then added to the driving signal generation unit 400, the number of added transistors increases when viewed in terms of an entire semiconductor chip. In addition, as the area of a sub-hole region increases in terms of a layout, waste of an area is caused between cell arrays. As a result, the size of the semiconductor chip may markedly increase.

In this consideration, in an embodiment of the invention, the driving signal generation unit 400 is disposed in the sub-hole region, and the test control unit 500 is disposed in a core-hole region. The driving signal generation unit 400 generates the sub word line select signal FXB and outputs it to the discharge section 320_1. Further, the test control unit 500 generates the sub word line driving signal FX and outputs it to the driving section 310_1.

The sub-hole region may represent a region where the sub word line driving unit 300_1, a sense amplifier driver to generate a sense amplifier driving signal, a bit line equalize driver to generate a bit line equalize signal, a bit line isolation driver to generate a bit line isolation signal, and so forth are disposed. In the core-hole region, circuits to control row-related operations of a bank may be disposed. More specifically, the word line decoder 100_1, a main word line driving unit, and so forth may be disposed.

Therefore, an embodiment of the invention has a layout structure in which the test control unit 500 is disposed in the core-hole region. Even though the test control unit 500 is added to the core-hole region, an advantage may be provided in terms of a layout area as compared to the case where the circuit of the test control unit 500 is added to the sub-hole region.

The operating procedure of the semiconductor device in accordance with an embodiment of the invention shown in FIG. 3, configured as mentioned above, will be described below.

The main word line select signal MWLB is enabled to a logic low level 'L,' the PMOS transistor P3 is turned on. Further, as the input signal IN becomes a logic high level 'H,' the sub word line driving signal FX is then enabled to a logic high level 'H,' and the sub word line SWL is activated to a high level.

Thereafter, as the input signal IN transitions to a logic low level 'L,' the PMOS transistor P6 is then turned on. Then, the sub word line driving signal FX is disabled to a logic low level 'L.' In addition, the sub word line SWL transitions to a low level.

In this state, where a contact hole between the sub word line SWL and the node ND2 is not open, the resistance of the sub word line SWL may increase. In addition, the leakage path (G) may be formed to the test control unit 500.

Due to this fact, in an embodiment of the invention, where the input signal IN to select a sub word line transitions to the logic low level 'L,' the main word line select signal MWLB is retained at the logic low level 'L' according to the test signal TM. The test signal TM controls the main word line select signal MWLB to be disabled for a test period after the input signal IN transitions to the logic low level 'L.'

In order to block the leakage path (G) formed to the terminal of the ground voltage in the state where the main word line select signal MWLB has the logic low level 'L' and the input signal IN has the logic low level 'L,' the test signal TM is retained at the logic low state for the test period. Then, as the NMOS transistor N8 is turned off, the leakage path (G) formed to the terminal of the ground voltage may then be blocked.

In a general normal operation, the potential of the sub word line SWL falls before the test period. In contrast, in a test mode, the main word line select signal MWLB retains the logic low level state by the test signal TM. In addition, the leakage path blocking unit 510 retains the turned-off state. Consequently, the potential of the sub word line SWL does not fall and is retained as it is during the test period.

As a result, if data is not normally read or written when the test signal TM retains the logic low level during the test period, it may be determined that the contact hole's being not open has occurred in the sub word line driving unit 300_1. Further, a designer may monitor this and screen the contact hole's being not open.

Figure 4:
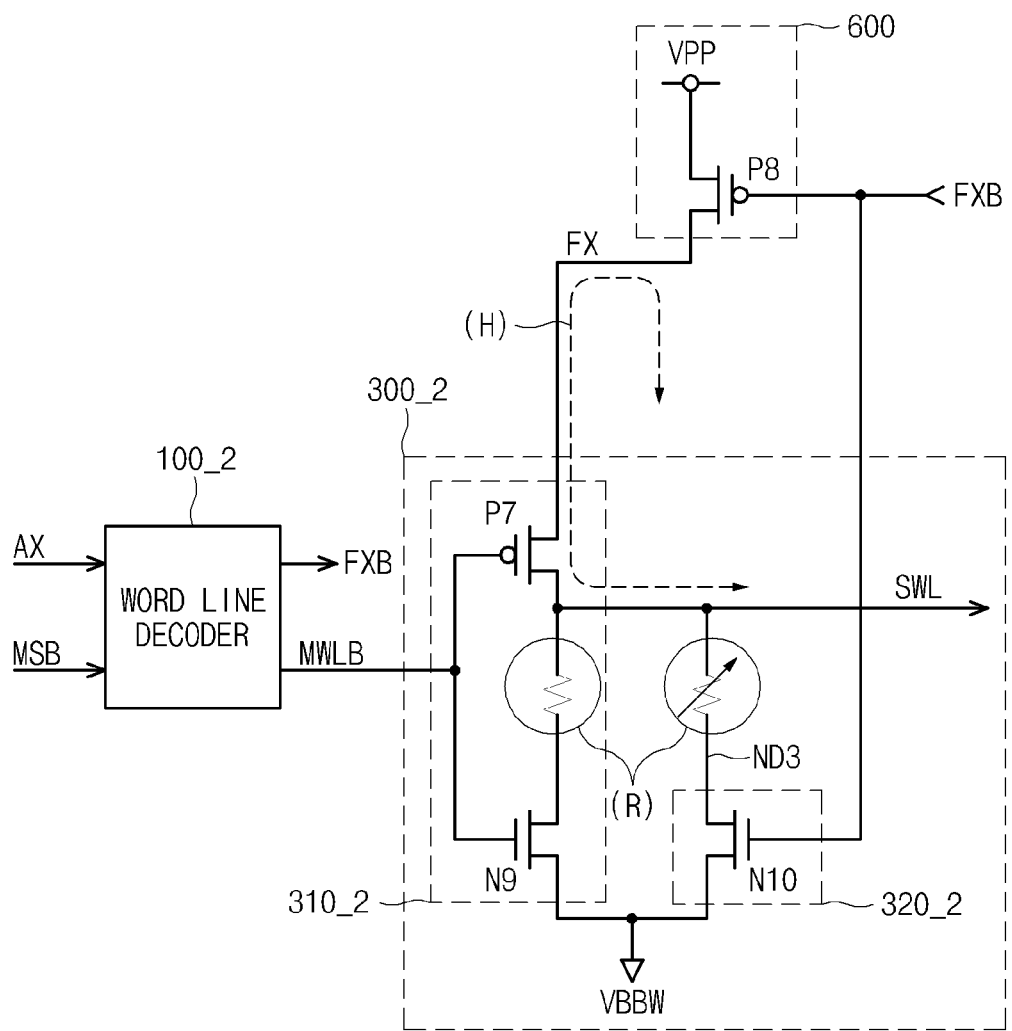
FIG. 4 is a configuration diagram of a semiconductor device in accordance with an embodiment of the invention.

Referring to FIG. 4, a configuration diagram of a semiconductor device in accordance with an embodiment of the invention is illustrated.

The semiconductor device in accordance with an embodiment includes a word line decoder 100_2, a driving signal generation unit 600, and a sub word line driving unit 300_2.

The word line decoder 100_2 decodes a row address AX and a cell block select signal MSB. The word line decoder 100_2 also generates a sub word line select signal FXB and a main word line select signal MWLB. The word line decoder 100_2 outputs the sub word line select signal FXB to the driving signal generation unit 600. Further, the word line decoder 100_2 outputs the main word line select signal MWLB to the sub word line driving unit 300_2.

The driving signal generation unit 600 selectively drives a sub word line driving signal FX in response to the sub word line select signal FXB. Moreover, the sub word line driving signal FX is an inverted signal of the sub word line select signal FXB.

The driving signal generation unit 600 includes a PMOS transistor P8. The PMOS transistor P8 is electrically coupled between the application terminal of a pumping voltage VPP and the output terminal of the sub word line driving signal FX. The PMOS transistor P8 is inputted with the sub word line select signal FXB through the gate terminal. The PMOS transistor P8 also outputs the sub word line driving signal FX to the sub word line driving unit 300_2 through the drain terminal.

A case may occur where a metal contact hole to electrically couple a sub word line SWL and a node ND3 is not open. In such an instance, the parasitic resistance of a metal line which electrically couples the sub word line SWL and the node ND3 increases as indicated by reference letter (R). At this time, the voltage of the sub word line SWL unnecessarily rises.

Accordingly, a leakage current path is formed from the sub word line SWL through the driving signal generation unit 600 to a ground voltage (VSS) line as indicated by reference letter (H). An embodiment shown in FIG. 5 does not include a transistor which is electrically coupled between the driving signal generation unit 600 and the ground voltage terminal. As a result, the driving signal generation unit 600 blocks the path of leakage current produced between the sub word line driving unit 300_2 and the driving signal generation unit 600.

The sub word line driving unit 300_2 selectively drives the sub word line SWL in response to the main word line select signal MWLB. The sub word line driving unit 300_2 may also selectively drive the sub word line SWL in response to the sub word line driving signal FX. The sub word line driving unit 300_2 includes a driving section 310_2 and a discharge section 320_2.

The driving section 310_2 includes a PMOS transistor P7 and an NMOS transistor N9. The PMOS transistor P7 and the NMOS transistor N9 are electrically coupled in series between the application terminal of the sub word line driving signal FX and the application terminal of a back bias voltage VBBW.

The PMOS transistor P7 and the NMOS transistor N9 are applied with the main word line select signal MWLB through the common gate terminal. The PMOS transistor P7 and the NMOS transistor N9 have the common drain terminal electrically coupled to the sub word line SWL.

The discharge section 320_2 includes an NMOS transistor N10. The NMOS transistor N10 is electrically coupled between the sub word line SWL and the application terminal of the back bias voltage VBBW. The NMOS transistor N10 is also inputted with the sub word line select signal FXB through the gate terminal.

Figure 5:
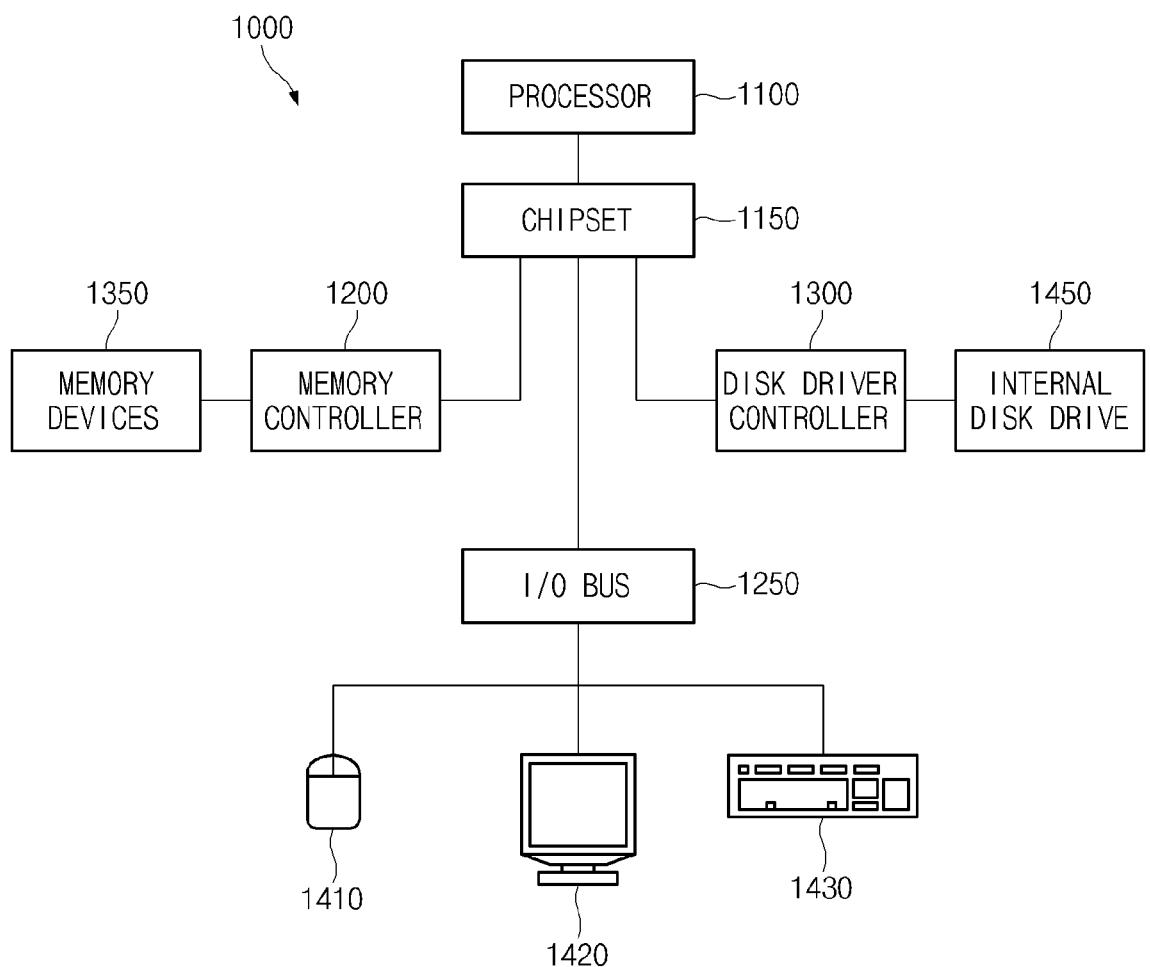
FIG. 5 illustrates a block diagram of a system employing a memory controller circuit in accordance with an embodiment of the invention.

Referring to FIG. 5, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components of the system 1000 may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory device 1350 may include the semiconductor device described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drive 1450 may communicate with each other or with the chipset 1150 using virtually any type of communication protocol.

As is apparent from the above descriptions, in the semiconductor device in accordance with the embodiments of the invention, it is possible to block an unnecessary current leakage path and screen a fail due to a contact hole's being not open.

While certain embodiments have been described above, it will be understood to those skilled in the art that the embodiments described are by way of example only. Accordingly, the semiconductor device described herein should not be limited based on the described embodiments above. Rather, the semiconductor device described herein should only be limited in light of the claims that follow when taken in conjunction with the above description and accompanying figures.

What is claimed is:

1. A semiconductor device comprising:
   a driving signal generation unit configured to selectively drive a sub word line driving signal in response to a sub word line select signal;
   a sub word line driving unit configured to drive a sub word line in response to a main word line select signal and the sub word line driving signal; and
   a leakage path blocking unit configured to block a leakage path formed from the sub word line through the driving signal generation unit, in response to a test signal.

2. The semiconductor device according to claim 1, wherein the leakage path blocking unit is configured to block the leakage path which extends from the sub word line through the driving signal generation unit to a ground voltage terminal, during a test period in which the main word line select signal has a low level.

3. The semiconductor device according to claim 1, wherein the leakage path is blocked as the test signal retains a disabled state during the test period in which the main word line select signal is activated and the sub word line driving signal is applied to the sub word line.

4. The semiconductor device according to claim 1, wherein the test signal controls the main word line select signal to be disabled for the test period after the sub word line select signal transitions to a high level.

5. The semiconductor device according to claim 1, wherein the leakage path blocking unit comprises:
   a MOS transistor controlled according to the test signal.

6. The semiconductor device according to claim 1, wherein the leakage path blocking unit comprises:
   an NMOS transistor electrically coupled between the driving signal generation unit and the ground voltage terminal and applied with the test signal through a gate terminal.

7. The semiconductor device according to claim 6, wherein, as the test signal becomes a low level during the test period and the NMOS transistor is turned off, the leakage path to the ground voltage terminal is blocked.

8. A semiconductor device comprising:
   a driving signal generation unit configured to selectively drive a sub word line select signal in response to a sub word line driving signal;
   a sub word line driving unit configured to drive a sub word line in response to a main word line select signal and the sub word line driving signal; and
   a test control unit configured to output the sub word line driving signal to the driving signal generation unit in response to an input signal, and block a leakage path formed from the sub word line through the driving signal generation unit in response to a test signal.

9. The semiconductor device according to claim 8, further comprising:
   a delay unit configured to compensate for a delay time of the sub word line.

10. The semiconductor device according to claim 8, wherein the sub word line driving unit comprises:
    a driving section configured to selectively drive the sub word line in response to the main word line select signal and the sub word line driving signal; and
    a discharge section configured to selectively discharge the sub word line according to the sub word line select signal.

11. The semiconductor device according to claim 10, wherein the discharge section is configured to operate according to the sub word line select signal applied from the driving signal generation unit.

12. The semiconductor device according to claim 10, wherein the driving section is configured to operate according to the sub word line driving signal applied from the test control unit.

13. The semiconductor device according to claim 8, wherein the driving signal generation unit is disposed in a sub-hole region.

14. The semiconductor device according to claim 8, wherein the test control unit is disposed in a core-hole region.

15. The semiconductor device according to claim 8, wherein the test control unit comprises:
    a leakage path blocking unit configured to block a leakage path produced from the sub word line through the driving signal generation unit according to the test signal.

16. The semiconductor device according to claim 15, wherein the leakage path blocking unit is configured to block the leakage path which extends from the test control unit to a ground voltage terminal, as the test signal becomes a low level during a test period in which the main word line select signal has a low level.

17. The semiconductor device according to claim 8, wherein the test control unit comprises:
    a plurality of inverters configured to delay the input signal and output the sub word line driving signal; and
    a PMOS transistor electrically coupled between an application terminal of a pumping voltage and connection nodes of the plurality of inverters, and configured to operate in correspondence to an output of the plurality of inverters.

18. A semiconductor device comprising:
    a driving signal generation unit configured to selectively drive a sub word line driving signal in response to a sub word line select signal;
    a sub word line driving unit configured to drive a sub word line in response to a main word line select signal and the sub word line driving signal; and
    a leakage path blocking unit configured to block a leakage path formed from the sub word line through the driving signal generation unit.

19. The semiconductor device according to claim 18, wherein the driving signal generation unit is configured to output the sub word line driving signal to the sub word line driving unit, as the sub word line select signal becomes a low level during a test period in which the main word line select signal has a low level.

20. The semiconductor device according to claim 18, wherein in a test mode, the main world select signal is configured to be disabled according to a test signal, and a leakage path blocking unit is configured to be turned off.

* * * * *